(12) United States Patent
Kanda et al.

(10) Patent No.: US 6,599,820 B1
(45) Date of Patent: Jul. 29, 2003

(54) METHOD OF PRODUCING A SEMICONDUCTOR DEVICE

(75) Inventors: Yasuhiro Kanda, Tokyo (JP); Mitsuo Kimoto, Tokyo (JP); Kazuyoshi Maekawa, Tokyo (JP); Noboru Sekiguchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/695,223

(22) Filed: Oct. 25, 2000

(30) Foreign Application Priority Data

Dec. 22, 1999 (JP) .............................. 11-363865

(51) Int. Cl.⁷ ......................................... H01L 21/4763
(52) U.S. Cl. ................... 438/592; 438/308; 438/584; 438/585; 438/586
(58) Field of Search ................. 438/592, 584, 438/585, 308, 586

(56) References Cited

U.S. PATENT DOCUMENTS

| | | | | |
|---|---|---|---|---|
| 3,977,017 A | * | 8/1976 | Ishitani | |
| 5,278,448 A | * | 1/1994 | Fujii | |
| 5,605,854 A | * | 2/1997 | Yoo | |
| 5,726,497 A | * | 3/1998 | Chao et al. | |
| 5,903,027 A | * | 5/1999 | Yoshitomi et al. | |
| 6,200,432 B1 | * | 3/2001 | Kobayashi et al. | |
| 2001/0025972 A1 | * | 10/2001 | Moriwaki et al. | |

FOREIGN PATENT DOCUMENTS

JP          5-217936          8/1993

* cited by examiner

*Primary Examiner*—Long Pham
(74) *Attorney, Agent, or Firm*—McDermott, Will & Emery

(57) ABSTRACT

A method of producing a semiconductor device having a polymetal wiring structure fabricated by a polycrystalline silicon film, a reaction preventing film, and a tungsten film comprising steps of forming a polycrystalline silicon film 4 and a tungsten nitride film 13 on a silicon substrate 1; forming a tungsten film 14 using a target of tungsten containing fluorine of 10 ppm or less by a sputtering method; and forming a gate electrode 15 by patterning a polycrystalline silicon film 4, the tungsten nitride film 13, and the tungsten film 14, whereby a content of fluorine can be reduced, a film separation is prevented, and a preferable transistor property is obtainable.

1 Claim, 13 Drawing Sheets

METHOD OF PRODUCING A SEMICONDUCTOR DEVICE

BACKGROUND OF THE INVENTION

1. Field of the Invention

The present invention relates to a semiconductor device and a method of producing the semiconductor device, in particular, a method of producing a semiconductor device having a polymetal wiring made of a polycrystalline silicon, an reaction preventing film, and a polymetal wire made of tungsten, especially used for forming highly heat-resistant wire such as a gate electrode.

2. Discussion of Background

In recent years, in accordance with microminiaturization, high integration, and high speed of semiconductor devices, a development of wiring materials having a further small resistance is required. As a wiring material used at portions requiring heat resistance, e.g. a gate electrode of a transistor, instead of a polycide structure fabricated by a polycrystalline silicon film and a metallic silicide film having a high-melting point, a tungsten film being one of high-melting point metals, a polycrystalline silicon film, or polymetal wiring made of a silicide reaction preventing film including a tungsten film and a polycrystalline silicon film. This is because the polymetal wiring using the tungsten film is hoped as wiring having a low sheet resistance in comparison with polycide wiring without an increment of the height of a gate.

FIGS. 11a through 13 are cross-sectional views illustrating steps of a method of producing a conventional p-type MOS transistor having a gate electrode made of polymetal wiring. As illustrated in FIG. 11a, an element isolation insulating film 2 is formed on a silicon substrate 1 to separate an element forming region.

In the next, as illustrated in FIG. 11b, a gate oxide film 3 is formed on an entire surface of the silicon substrate 1.

In the next, as illustrated in FIG. 11c, a polycrystalline silicon film 4 is formed on an entire surface, and $BF_2$ is subjected to ion implantation to form gate wiring of a p-type.

In the next, as illustrated in FIG. 11d, a titanium nitride film 5 is formed on an entire surface of the polycrystalline silicon film 4 by a reactive sputtering method using a metallic target such as Ti. This titanium nitride 5 is served as a reaction preventing film preventing a reaction between the polycrystalline silicon film 4 and a tungsten film to be formed later.

In the next, as illustrated in FIG. 11e, the tungsten film 6 is formed on an entire surface of the titanium nitride film 5 by a CVD method reducing tungsten hexafluoride by monosilane and hydrogen.

As illustrated in FIG. 12a, thee tungsten film 6, the titanium nitride film 5, the polycrystalline silicon film 4, and the gate oxide film 3 are simultaneously patterned to form a gate electrode 7 using a resist (not shown) as a mask.

In the next, as illustrated in FIG. 12b, after forming side walls 8 on both sides of the gate electrode 7, $BF_2$ is implanted in source/drain areas of the silicon substrate on both sides of the side walls 8 to form a p-type impurity diffusing layer 9, and is subjected to annealing at 800 through 1,000° C. for activation.

In the next, as illustrated in FIG. 12c, an inter-layer insulating film 10 made of an SiN film, a PSG film, and a BPSG film is formed on an entire surface. Thereafter, when the PSG film and/or the BPSG film are used, a thermal treatment at 800 through 1,000° C. is performed. This thermal treatment is an indispensable step because a quality of the inter-layer insulating film 10 is improved and planarized.

In the next, as illustrated in FIG. 12d, a contact hole 11 is opened at a predetermined position on the gate electrode 7 and the impurity diffusing layer 9. Further, there is a case that $BF_2$ being an impurity of a type same as that of the impurity diffusing layer 9 is implanted in the semiconductor substrate from an opening portion of the contact hole 11, and the impurity is diffused by a thermal treatment at 800 through 1,000° C.

Finally, as illustrated in FIG. 13, a metallic wire 12 made of aluminum and so on is formed, whereby a transistor having the gate electrode 7, fabricated by the tungsten film 6, the titanium nitride 5 being the reaction preventing film, and the polycrystalline silicon film 4, is completed.

The method of producing the conventional p-type MOS transistor using the polymetal wiring as the gate electrode wiring is as described. As illustrated in FIGS. 12b, 12c, and 12d, the impurity diffusing layer 9 is activated as described, wherein the thermal treatment process at 800 through 1,000° C. is indispensable in order to improve the quality of the inter-layer insulating film 10 and planarizing the inter-layer insulating film 10.

Further, in the method of producing the conventional p-type MOS transistor, fluorine is taken in the polymetal wiring film in the following steps of the production.

(1) As illustrated in FIG. 11c, fluorine contained in the $BF_2$ implanted in the polycrystalline silicon film 4 for forming the gate wiring of a p-type.

(2) As illustrated in FIG. 11e, fluorine contained in the tungsten hexafluoride used at time of forming the tungsten film 6 by the CVD method.

(3) As illustrated in FIGS. 12b and 12d, fluorine contained in $BF_2$ implanted in the silicon substrate 1 and the tungsten film 6 at time of ion-implanting $BF_2$ for forming the p-type impurity diffusing layer 9.

By the thermal treatment of fluorine taken in the polymetal wiring film, fluorine diffuses toward an interface between the polycrystalline silicon film 4 and the tungsten film 6 of the polymetal wiring, whereby a contact between the polycrystalline silicon film 4 and the tungsten film 6 is deteriorated. As a result, there is a problem that the polycrystalline silicon film 4 and the tungsten film 6 are separated at an interface therebetween during or after the thermal treatment or by stresses of the inter-layer insulating film 10 and of a film of metallic wiring 12.

Further, fluorine in the polymetal wiring diffuses and reaches the gate oxide film 3 by the thermal treatment, whereby an effective capacitance of the gate oxide film 3 increases. As a result, the effective film thickness of the gate oxide film is larger than a designed value, whereby there is a problem that a property of a transistor is deteriorated.

SUMMARY OF THE INVENTION

The present invention is provided to solve the above-mentioned problems inherent in the conventional techniques, and to provide a method of producing a semiconductor device having a polymetal wiring structure, by which a content of fluorine can be reduced, a film separation is prevented, and a preferable transistor property is obtainable.

According to a first aspect of the present invention, there is provided a method of producing a semiconductor device, wherein a tungsten film is formed by a sputtering method, and a content of fluorine in a target, used in the sputtering method, is 10 ppm or less.

According to a second aspect of the present invention, there is provided a method of producing a semiconductor device, wherein a tungsten film is formed by a sputtering method, and a temperature of a silicon substrate, formed by the sputtering method, is maintained to be 200° C. or more.

According to a third aspect of the present invention, there is provided a method of producing a semiconductor device comprising a step of annealing the semiconductor device at 600° C. or more after ion-implanting $BF_2$ in a polycrystalline silicon film and before forming a reaction preventing film.

According to a fourth aspect of the present invention, there is provided a method of producing a semiconductor device, wherein a step of annealing is conducted in a vacuum for a reactive atmosphere for fluorine.

According to a fifth aspect of the present invention, there is provided a method of producing a semiconductor device comprising steps of sequentially forming a gate oxide film, a polycrystalline silicon film, a reaction preventing film, and a tungsten film on a silicon substrate; forming a silicon nitride film on the tungsten film; patterning the silicon nitride film; simultaneously patterning the gate oxide film, the polycrystalline silicon film, the reaction preventing film, and the tungsten film using the patterned silicon nitride film as a mask to form a gate electrode; and implanting p-type ions containing fluorine in the silicon substrate using the patterned silicon nitride film and the gate electrode as a mask to form an impurity diffusing layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

A detailed explanation will be given of preferred embodiments of the present invention in reference to FIGS. 1 through 10c as follows, wherein the same numerical references are used for the same or similar portions and description of these portions is omitted.

Embodiment 1

FIGS. 1a through 2c are cross-sectional views illustrating steps of a method of producing a p-type MOS transistor according to Embodiment 1 of the present invention.

Figure 1A:
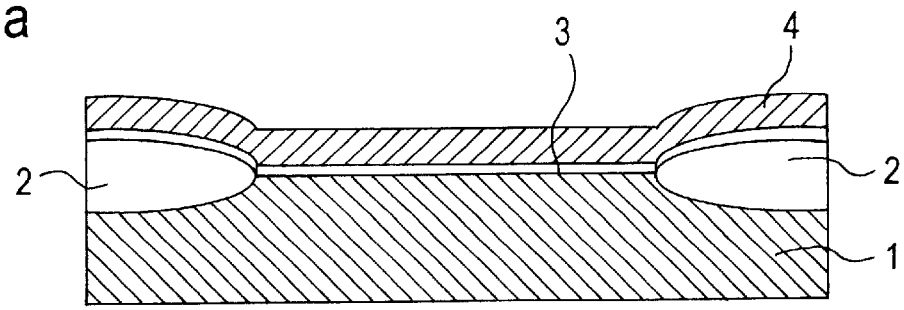
FIG. 1a is a cross-sectional view of a p-type MOS transistor illustrating a step of a method of producing the MOS transistor according to Embodiment 1 of the present invention.

As illustrated in FIG. 1a, element isolation insulating films 2 are formed on a silicon substrate 1 to separate an element forming region. Thereafter, a gate oxide film 3 and a polycrystalline silicon film 4 are sequentially formed. The film thickness of the polycrystalline silicon film 4 is 50 through 200 nm.

Figure 1B:
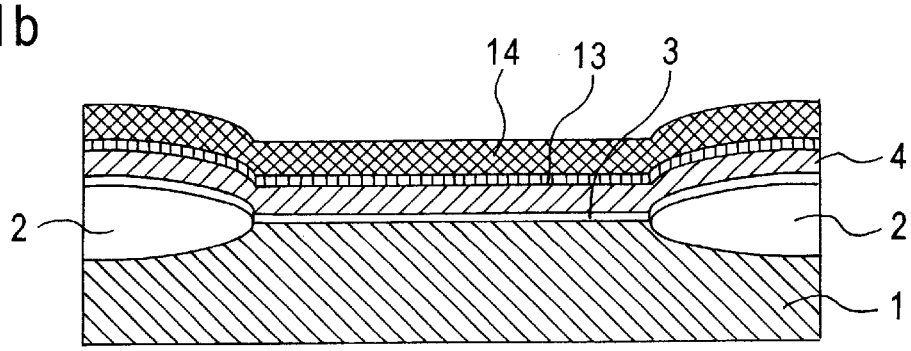
FIG. 1b is a cross-sectional view of the p-type MOS transistor illustrating a step of the method of producing the MOS transistor according to Embodiment 1 of the present invention.

In the next, as illustrated in FIG. 1b, a tungsten nitride film 13 is formed on an entire surface of the polycrystalline silicon film 4 by a reactive sputtering method using a metallic target such as tungsten and so on. Succeedingly, a tungsten film 14 is formed by a sputtering method. The tungsten nitride film 13 is a reaction preventing film preventing a reaction between the polycrystalline silicon film 4 and the tungsten film 14.

The target used in the sputtering method is tungsten containing fluorine of 10 ppm or less. The target used by the sputtering method is formed by a CVD method. Therefore, it is impossible to render the content of fluorine 0. However, by forming a target containing fluorine of 10 ppm or less and sputtering in use of the target, it is possible to drastically reduce the quantity of fluorine in an atmosphere of forming the tungsten film 14. As a result, the quantity of fluorine taken in the tungsten film 14 can be reduced.

Figure 1C:
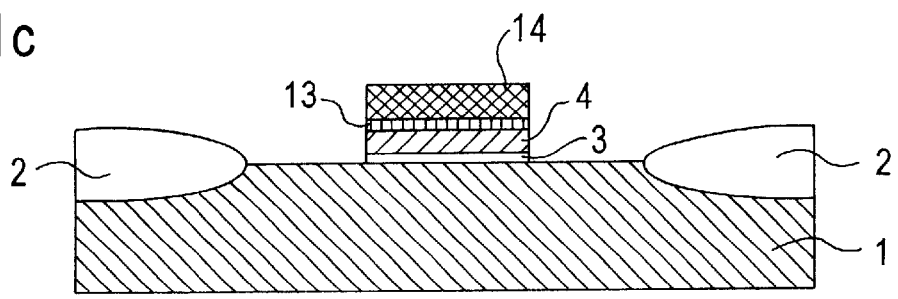
FIG. 1c is a cross-sectional view of the p-type MOS transistor illustrating a step of the method of producing the MOS transistor according to Embodiment 1 of the present invention.

In the next, as illustrated in FIG. 1c, a gate electrode 15 is formed by simultaneously patterning the tungsten film 14, the tungsten nitride film 13, the polycrystalline silicon film 4, and the gate oxide film 3 using a resist (not shown) as a mask.

Figure 1D:
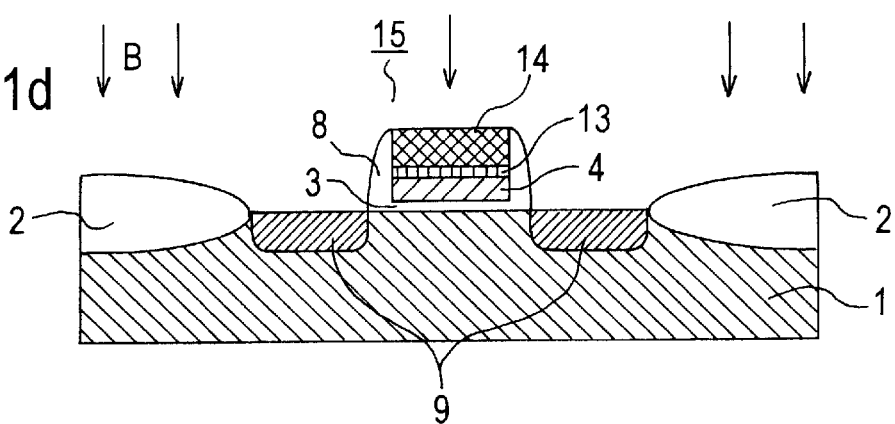
FIG. 1d is a cross-sectional view of the p-type MOS transistor illustrating a step of the method of producing the MOS transistor according to Embodiment 1 of the present invention.

In the next, as illustrated in FIG. 1d, after forming side walls 8 on both sides of the gate electrode 15, p-type ions are implanted into source/drain areas of the silicon substrate 1 on both sides of the side wall 8 to form a p-type impurity diffusing layer 9. Thereafter, the silicon substrate is annealed at 800 through 1,000° C. to activate.

When the impurity diffusing layer 9 is formed by implanting a p-type impurity having a high concentration, ions to be implanted is B without containing fluorine but $BF_2$. Therefore, the impurity simultaneously implanted in the tungsten film 14 is B at time of forming the impurity diffusing layer 9. Therefore, it is possible to prevent fluorine from being implanted in the tungsten film 14, whereby fluorine contained in tungsten film 14 is sufficiently reduced.

Figure 2A:
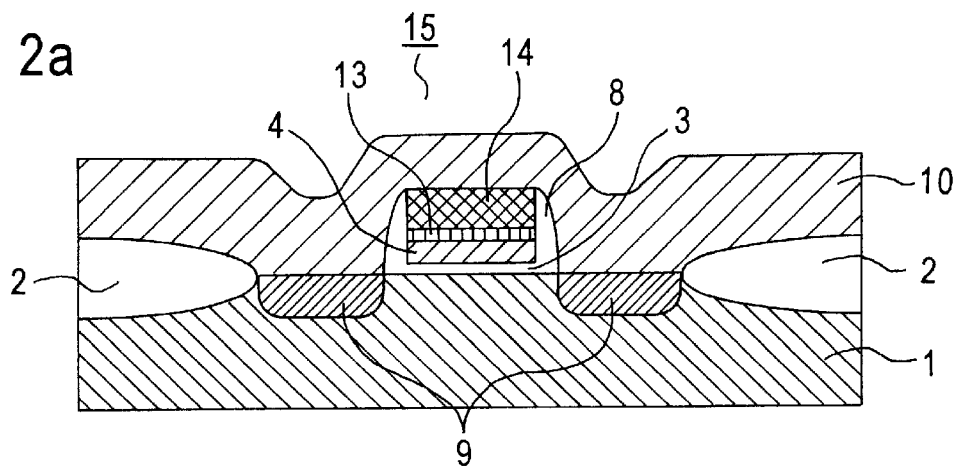
FIG. 2a is a cross-sectional view of the p-type MOS transistor illustrating a step of the method of producing the MOS transistor according to Embodiment 1 of the present invention.

In the next, as illustrated in FIG. 2a, an inter-layer insulating film 10 made of a SiN film, a PSG film and a BPSG film are formed on an entire surface. Thereafter, when the PSG film and the BPSG film are used, a thermal treatment is performed at a temperature of 800 through 1,000° C. This thermal treatment improves a quality of the inter-layer insulating film 10 and simultaneously planarize this. Therefore, the thermal treatment is an indispensable step.

Figure 2B:
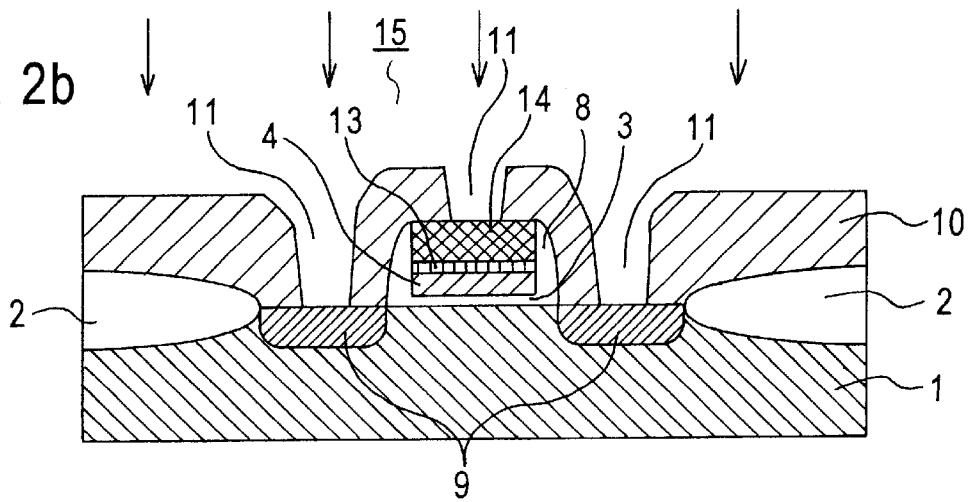
FIG. 2b is a cross-sectional view of the p-type MOS transistor illustrating a step of the method of producing the MOS transistor according to Embodiment 1 of the present invention.

In the next, as illustrated in FIG. 2b, a contact hole 11 is opened at a predetermined position in the gate electrode and the impurity diffusing layer 9. Further, there is a case that an impurity of a type same as that of the impurity diffusing layer 9 is implanted in the semiconductor substrate 1 from the opening portion of the contact hole 11, and the impurity is diffused by applying a heat of 800 through 1,000° C.

Figure 2C:
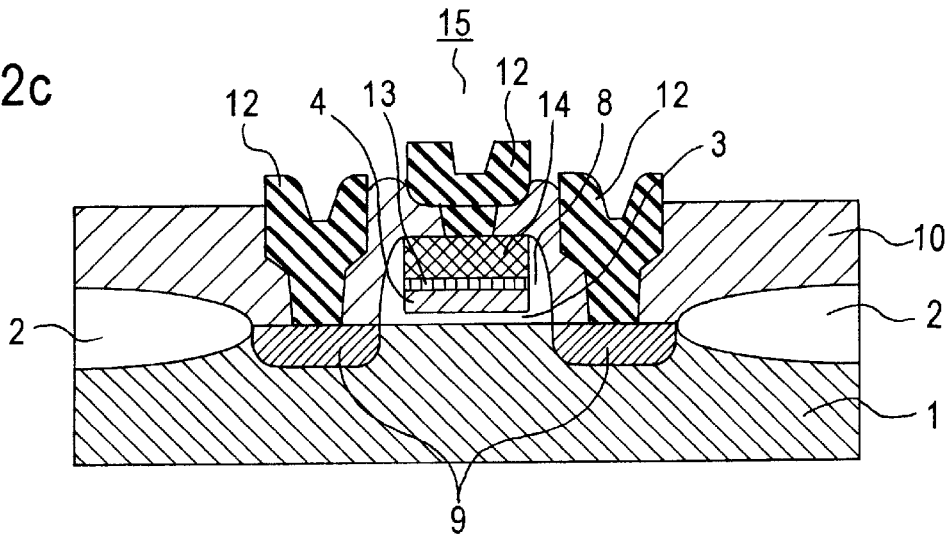
FIG. 2c is a cross-sectional view of the p-type MOS transistor illustrating a step of the method of producing the MOS transistor according to Embodiment 1 of the present invention.

Finally, as illustrated in FIG. 2c, a metallic wire 12, made of aluminum and so on, is formed to complete a transistor using the gate electrode 15 formed by a polymetal wire made of the tungsten film 14, the tungsten nitride film 13, and the polycrystalline silicon film 4.

In other words, in Embodiment 1, when the tungsten film 14 of the polymetal wire is formed, the sputtering method is used instead of the CVD method, and the content of fluorine contained in the target for sputtering is 10 ppm or less. Further, when the impurity diffusing layer 9 is formed by implanting the p-type impurity of the high concentration, the ions to be implanted is B without fluorine but $BF_2$. Therefore, when the tungsten film 14 and the impurity diffusing layer 9 are formed, it is possible to reduce the amount of fluorine taken in the tungsten film 14.

Accordingly, it is possible to sufficiently reduce fluorine contained in the tungsten film 14, and prevents a deterioration of a property of the gate oxide film and a separation between the tungsten film 14 and the polycrystalline silicon film 4.

Embodiment 2

FIGS. 3a through 4c are cross-sectional views illustrating steps of a method of producing a p-type MOS transistor according to Embodiment 2 of the present invention.

Figure 3A:
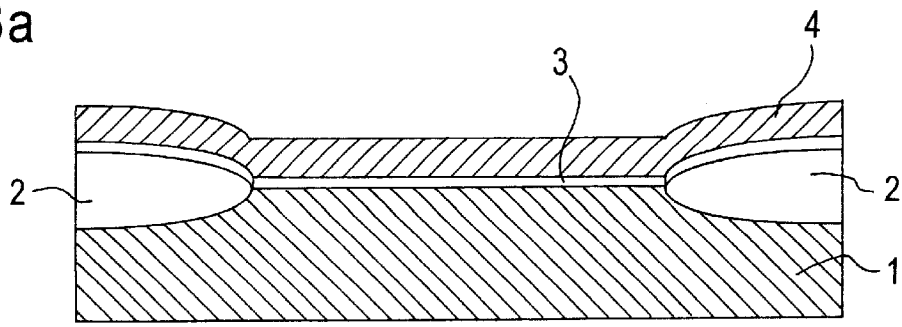
FIG. 3a is a cross-sectional view of a p-type MOS transistor illustrating a step of a method of producing the MOS transistor according to Embodiment 2 of the present invention.

As illustrated in FIG. 3a, in a similar manner to that described in the above embodiment, element isolation insulating films 2 are formed on a silicon substrate to separate an element forming region. Thereafter, a gate oxide film 3 and a polycrystalline silicon film 4 are sequentially formed. At this time, the polycrystalline silicon film 4 has a film thickness of 50 through 200 nm.

Figure 3B:
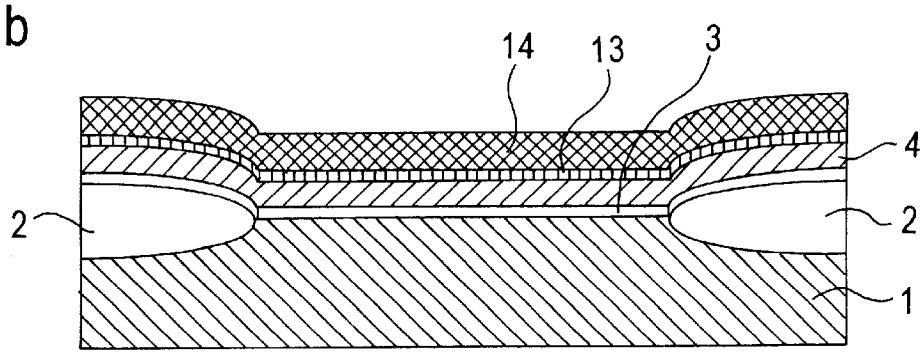
FIG. 3b is a cross-sectional view illustrating the p-type MOS transistor illustrating a step of the method of producing the MOS transistor according to Embodiment 2 of the present invention.

In the next, as illustrated in FIG. 3b, a tungsten nitride film 13 is formed on an entire surface of the polycrystalline silicon film 4 by a reactive sputtering method using a metallic target such as tungsten and so on. Succeedingly, a tungsten film 14 is formed by a sputtering method. At this time, a temperature of the silicon substrate 1 is maintained at about 200 through 400° C. at time of forming the tungsten film 14. The tungsten nitride film 13 is a reaction preventing film preventing a reaction between the polycrystalline silicon film 4 and the tungsten film 14.

As a result of an experiment, according to this temperature setting, when the temperature of silicon substrate 1 reaches 200° C. when the tungsten film 14 is formed, a gas containing fluorine starts to generate from a wafer subjected to a film formation. When the temperature of the silicon substrate increases, a stress applied to the tungsten film 14 is increased. Therefore, an upper limit of the temperature is supposed to be about 400° C.

Accordingly, provided that fluorine reaches the wafer, by maintaining the temperature of the silicon substrate subjected to the film formation of the tungsten film 14 at about 200 through 400° C, fluorine can be preferably separated from the wafer at time of forming the tungsten film 14. As a result, the amount of fluorine in the tungsten film can be reduced.

However, when the tungsten film is formed by a CVD method as in the conventional method of producing, because the content of fluorine at time of forming the film is extremely large, fluorine is left in the tungsten film even though the film is formed at a high temperature.

Figure 3C:
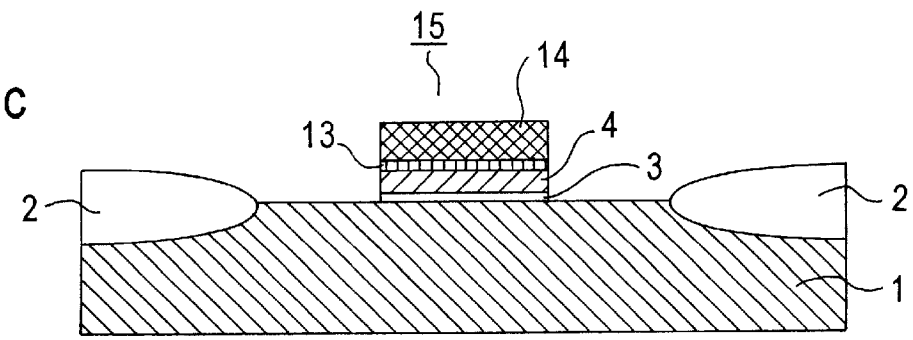
FIG. 3c is a cross-sectional view illustrating the p-type MOS transistor illustrating a step of the method of producing the MOS transistor according to Embodiment 2 of the present invention.

In the next, in a manner similar to the above embodiment, as illustrated in FIG. 3c, a gate electrode 15 is formed by simultaneously patterning the tungsten film 14, the tungsten nitride film 13, the polycrystalline silicon film 4, and the gate oxide film 3 using a resist (not shown) as a mask.

Figure 3D:
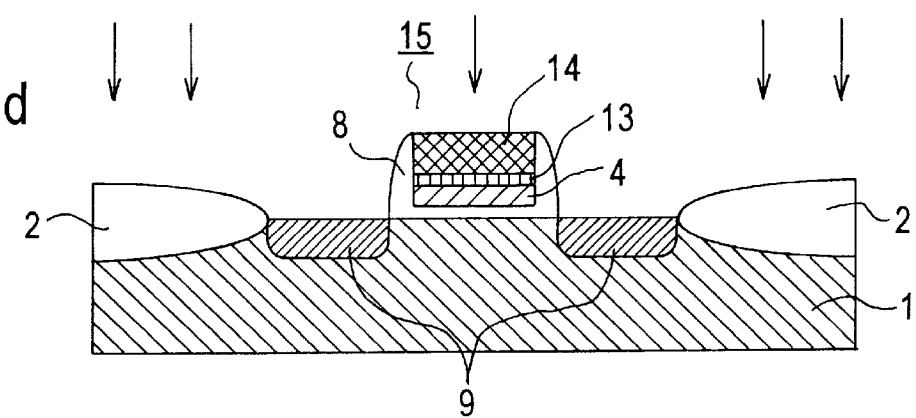
FIG. 3d is a cross-sectional view illustrating the p-type MOS transistor illustrating a step of the method of producing the MOS transistor according to Embodiment 2 of the present invention.

In the next, as illustrated in FIG. 3d, after forming side walls 8 on both sides of the gate electrode 15, a p-type impurity diffusing layer 9 is formed in source/drain areas of the silicon substrate 1 on both sides of the side walls 8, and is subjected to annealing at 800 through 1,000° C. for activating.

Figure 4A:
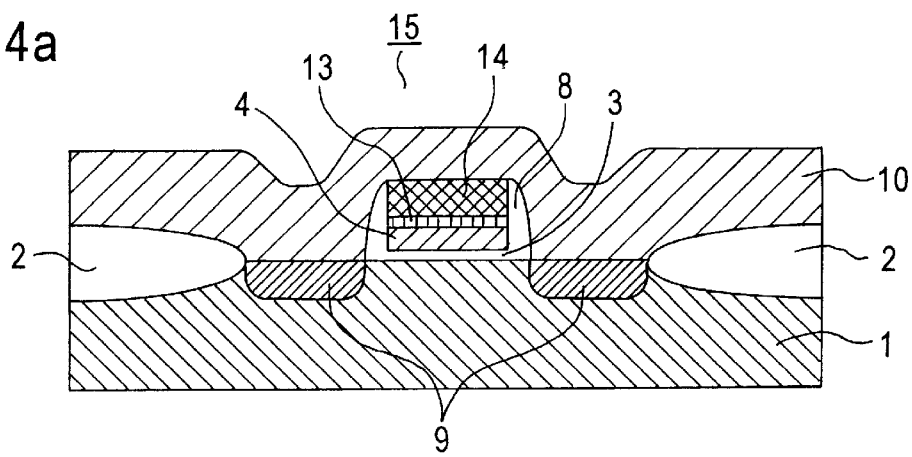
FIG. 4a is a cross-sectional view illustrating the p-type MOS transistor illustrating a step of the method of producing the MOS transistor according to Embodiment 2 of the present invention.

In the next, as illustrated in FIG. 4a, an inter-layer insulating film 10 made of an SiN film, a PSG film, and a BPSG film is formed on an entire surface. Thereafter, when the PSG film and the BPSG film are used, a thermal treatment at 800 through 1,000° C. is performed. This thermal treatment improves a quality of the inter-layer insulating film 10 and planarizes this. Therefore, the thermal treatment is an indispensable step.

Figure 4B:
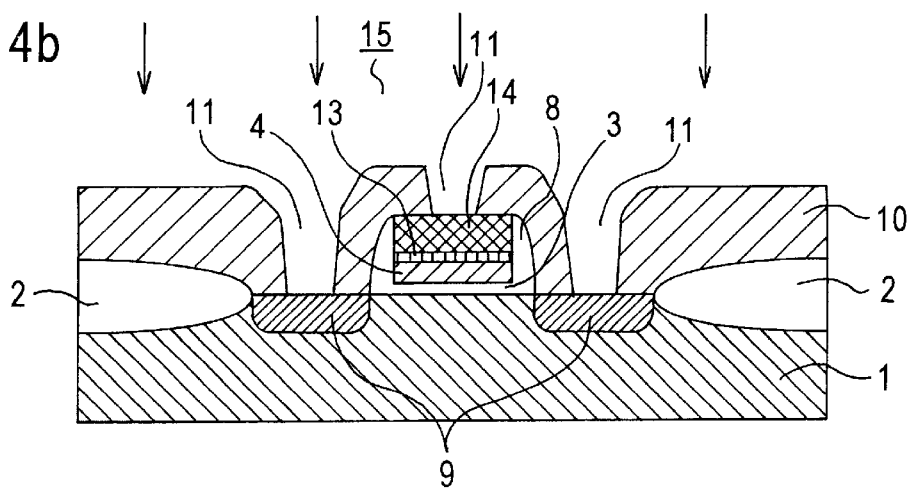
FIG. 4b is a cross-sectional view illustrating the p-type MOS transistor illustrating a step of the method of producing the MOS transistor according to Embodiment 2 of the present invention.

In the next, as illustrated in FIG. 4b, a contact hole 11 is opened at a predetermined position in the gate electrode 15 and the impurity diffusing layer 9. Further, there is a case that an impurity of a type same as the impurity diffusing layer 9 is implanted in the semiconductor substrate 1 through the opening of the contact hole 11, and the impurity is diffused by applying a heat of 800 through 1,000° C.

Figure 4C:
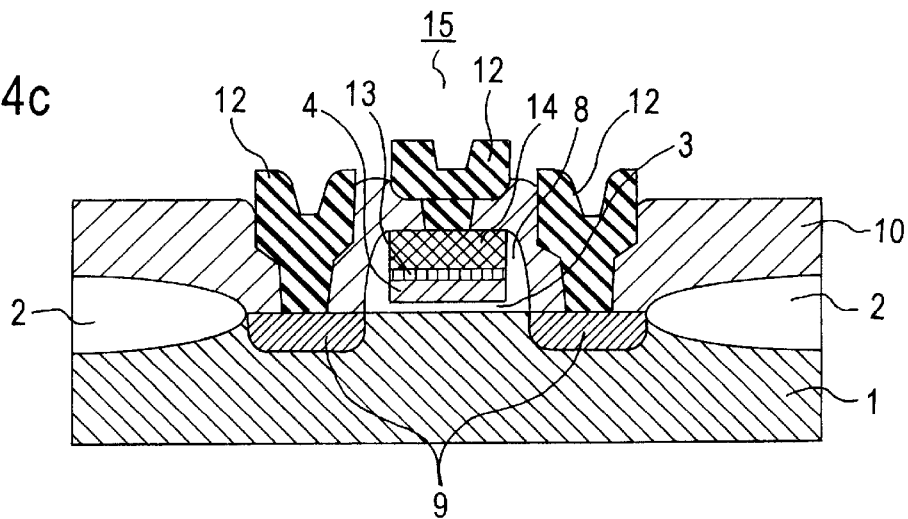
FIG. 4c is a cross-sectional view illustrating the p-type MOS transistor illustrating a step of the method of producing the MOS transistor according to Embodiment 2 of the present invention.

Finally, as illustrated in FIG. 4c, a metallic wire 12 made of aluminum and so on is formed to complete a transistor having the gate electrode 15 formed by a polymetal wire made of the tungsten film 14, the tungsten nitride film 13, and the polycrystalline silicon film 4.

In other words, in Embodiment 2, the tungsten film 14 is formed by a sputtering method, and a temperature of the silicon substrate 1 is maintained about 200 through 400° C. at time of forming the tungsten film 14. Accordingly, it is possible to preferably separate fluorine from the wafer at time of forming the tungsten film 14 and reduce the amount of fluorine in the tungsten film 14.

Accordingly, it is possible to sufficiently reduce fluorine contained in the tungsten film 14, and prevents an increment of a capacitance of the gate oxide film 3 and a separation between the tungsten film 14 and the polycrystalline silicon film 4.

Further, it is needless to say that the tungsten film having low content of fluorine can be formed by practicing Embodiment 2 along with Embodiment 1.

Embodiment 3

In this embodiment, a case that $BF_2$ of a high concentration of a dose of $10^{15}/cm^2$ or more is implanted in a polycrystalline silicon film 4 forming a polymetal wire will be described.

FIGS. 5a through 6c are cross-sectional views illustrating steps of a method of producing a p-type MOS transistor according to Embodiment 3 of the present invention.

Figure 5A:
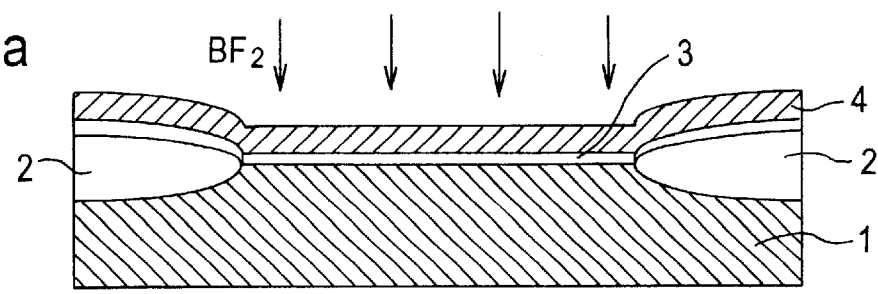
FIG. 5a is a cross-sectional view of a p-type MOS transistor illustrating a step of a method of producing the MOS transistor according to Embodiment 3 of the present invention.

At first, as illustrated in FIG. 5a, element isolation insulating films 2 are formed in a silicon substrate 1 to separate an element forming region. Thereafter, a gate oxide film 3 and a polycrystalline silicon film 4 are sequentially formed. At this time, the polycrystalline silicon film 4 has a film thickness of 50 through 200 nm. Thereafter, $BF_2$ of a high concentration is implanted in the polycrystalline silicon film 4 to form a p-type gate wire.

Figure 5B:
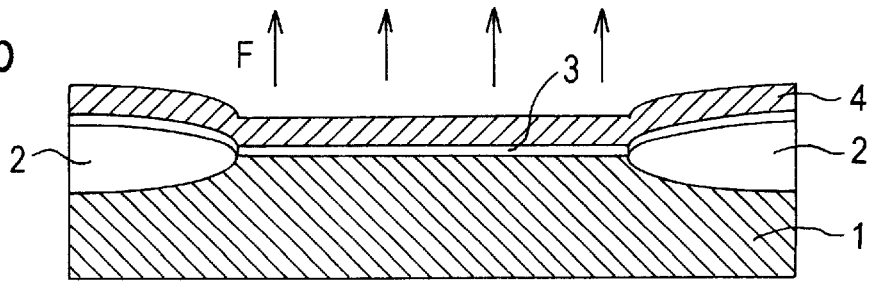
FIG. 5b is a cross-sectional view of the p-type MOS transistor illustrating a step of the method of producing the MOS transistor according to Embodiment 3 of the present invention.

In the next, as illustrated in FIG. 5b, annealing is performed at about 600 through 1,000° C. in an atmosphere of nitrogen. Thus, fluorine in $BF_2$, implanted in the polycrystalline silicon film 4, can be outward diffused. At this time, because fluorine is implanted in the polycrystalline silicon film 4, it is confirmed that the fluorine can be outward diffused by heating the tungsten film 14 at a temperature of 600° C., higher than 200° C., necessary for separating the fluorine from the wafer at time of forming the tungsten film 14 in Embodiment 2. Further, in consideration of other steps of the production, an upper limit temperature for annealing is about 1,000° C.

Further, the annealing is performed by an irradiation of laser. Further, when the annealing is performed in a vacuum or an atmosphere of monosilane and so on, in which fluorine is reactive, an outward diffusion of the fluorine can be further effectively promoted.

Figure 5C:
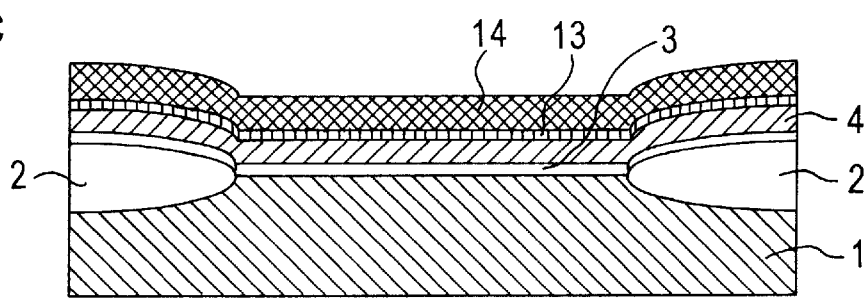
FIG. 5c is a cross-sectional view of the p-type MOS transistor illustrating a step of the method of producing the MOS transistor according to Embodiment 3 of the present invention.

In the next, in a manner similar to the above embodiment, as illustrated in FIG. 5c, a tungsten nitride film 13 is formed on an entire surface of the polycrystalline silicon film 4 by a reactive sputtering method using a metallic target such as tungsten and so on. Succeedingly, a tungsten film 14 is formed by a sputtering method.

Figure 5D:
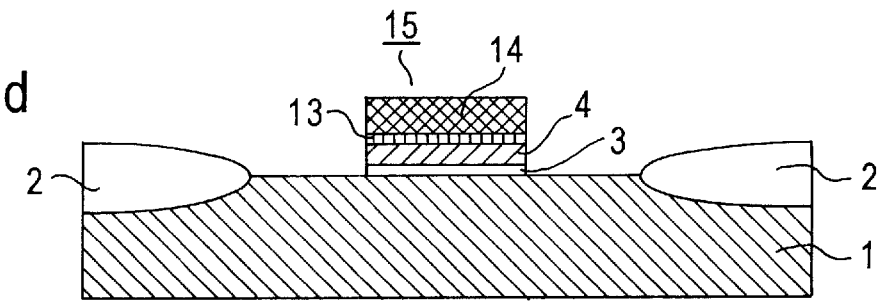
FIG. 5d is a cross-sectional view of the p-type MOS transistor illustrating a step of the method of producing the MOS transistor according to Embodiment 3 of the present invention.

In the next, as illustrated in FIG. 5d, a gate electrode 15 is formed by simultaneously patterning the tungsten film 14, the tungsten nitride film 13, the polycrystalline silicon film 4, and the gate oxide film 3 using a resist (not shown) as a mask.

Figure 5E:
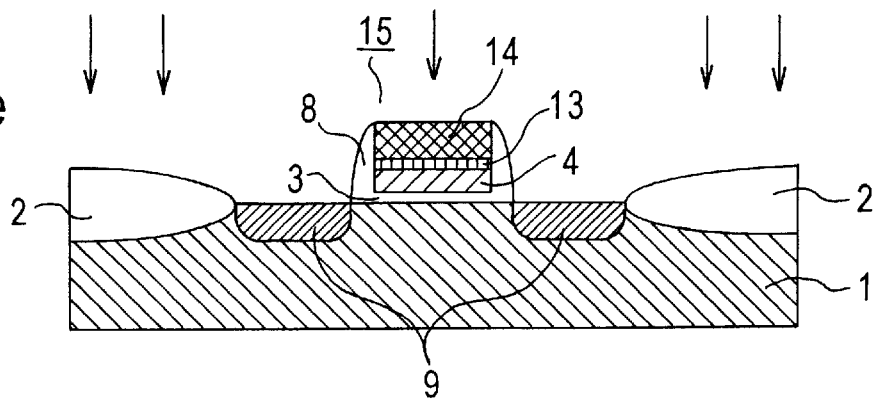
FIG. 5e is a cross-sectional view of the p-type MOS transistor illustrating a step of the method of producing the MOS transistor according to Embodiment 3 of the present invention.

In the next, as illustrated in FIG. 5e, after forming the sidewalls on the both sides of the gate electrode 15, a p-type impurity diffusing layer is formed in source/drain areas of the silicon substrate 1 on both sides of the side walls 8, and annealing at 800 through 1,000° C. is performed for activating.

Figure 6A:
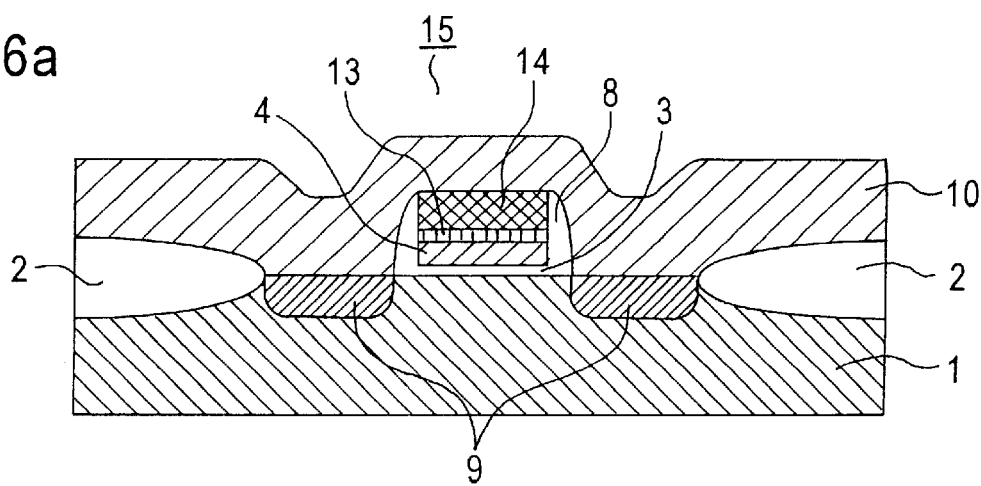
FIG. 6a is a cross-sectional view of the p-type MOS transistor illustrating a step of the method of producing the MOS transistor according to Embodiment 3 of the present invention.

In the next, as illustrated in FIG. 6a, an inter-layer insulating film 10 made of an SiN film, a PSG film, and a BPSG film is formed on an entire surface. Thereafter, when the PSG film and the BPSG film are used, a thermal treatment is performed at 800 through 1,000° C. The thermal treatment improves a quality of the inter-layer insulating film 10 and planarizes the inter-layer insulating film 10. Therefore, the thermal treatment is an indispensable step.

Figure 6B:
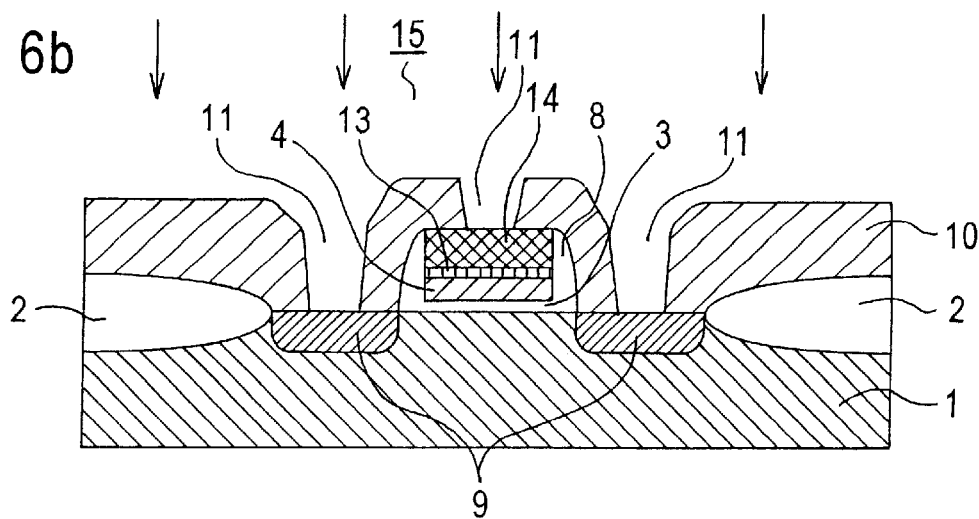
FIG. 6b is a cross-sectional view of the p-type MOS transistor illustrating a step of the method of producing the MOS transistor according to Embodiment 3 of the present invention.

In the next, as illustrated in FIG. 6b, a contact hole 11 is opened at a predetermined position on the gate electrode 15 and the impurity diffusing layer 9. Further, an impurity of a type same as that of the impurity diffusing layer 9 is implanted in the semiconductor substrate 1 through the opening of the contact hole 11, and the impurity is diffused by applying a heat of 800 through 1,000° C.

Figure 6C:
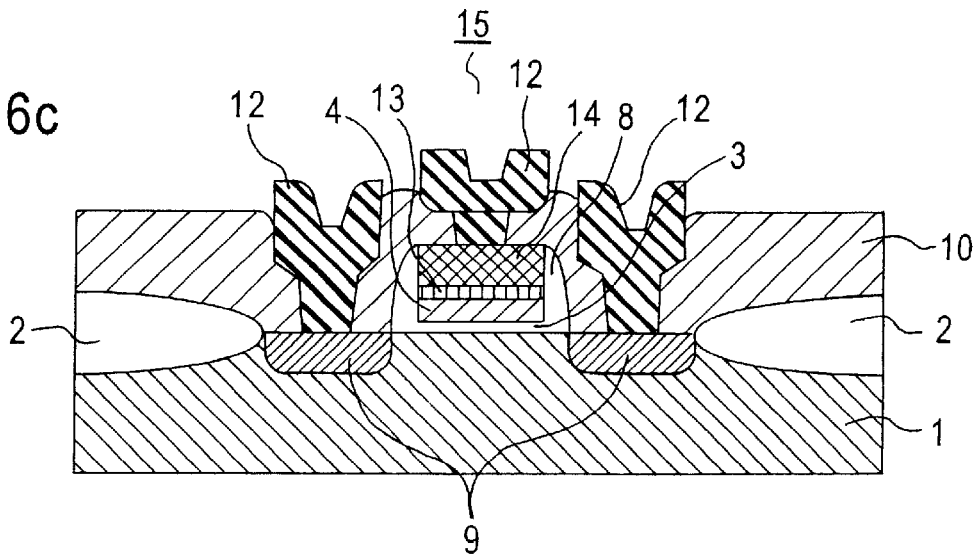
FIG. 6c is a cross-sectional view of the p-type MOS transistor illustrating a step of the method of producing the MOS transistor according to Embodiment 3 of the present invention.

Finally, as illustrated in FIG. 6c, a metallic wire 12 made of aluminum and so on is formed to complete a transistor having the gate electrode 15 formed by a polymetal wire made of the tungsten film 14, the tungsten nitride film 13, and the polycrystalline silicon film 4.

In other words, in Embodiment 3, the tungsten film 14 is formed by the sputtering method, and simultaneously, when $BF_2$ is implanted in the polycrystalline silicon film 4 to form the gate wire of the p-type, the annealing is performed at about 600° C. through 1,000° C. after implanting the ions of $BF_2$, whereby the fluorine is outward diffused from the polycrystalline silicon film 4. Accordingly, it is possible to sufficiently reduce fluorine contained in the polycrystalline silicon film 4, and prevent an increment of a capacitance of the gate oxide film 3 and a separation between the tungsten film 14 and the polycrystalline silicon film 4, which are caused by the diffusion of the fluorine at a heat treatment process.

Embodiment 4

FIGS. 7a through 8c are cross-sectional views illustrating steps of a method of producing a p-type MOS transistor according to Embodiment 4 of the present invention.

Figure 7A:
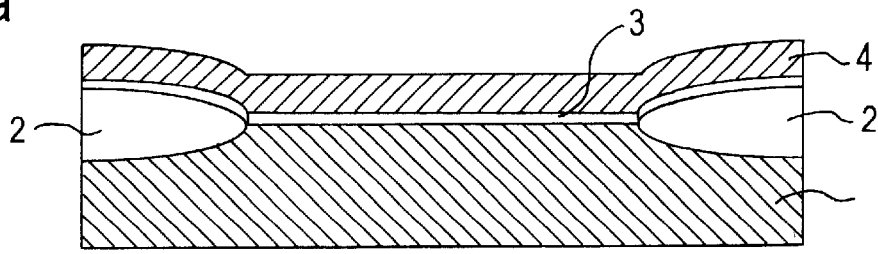
FIG. 7a is a cross-sectional view of a p-type MOS transistor illustrating a step of a method of producing the MOS transistor according to Embodiment 4 of the present invention.

At first, as illustrated in FIG. 7a, element isolation insulating films 2 are formed in a silicon substrate 1 to separate an element forming region. Thereafter, a gate oxide film 3 and a polycrystalline silicon film 4 are sequentially formed. At this time, the polycrystalline silicon film 4 as a film thickness of 50 through 200 nm.

Figure 7B:
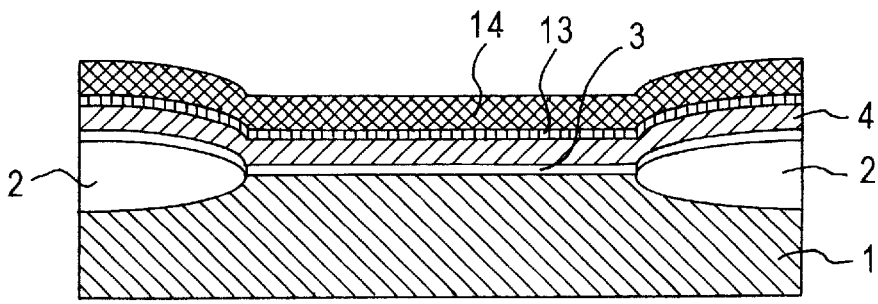
FIG. 7b is a cross-sectional view of the p-type MOS transistor illustrating a step of the method of producing the MOS transistor according to Embodiment 4 of the present invention.

In the next, as illustrated in FIG. 7b, a tungsten nitride film 13 is formed on an entire surface of the polycrystalline silicon film 4 by a reactive sputtering method using a metallic target such as tungsten. Succeedingly, a tungsten film 14 is formed by a sputtering method. The tungsten nitride film 13 is a reaction preventing film preventing a reaction between the polycrystalline silicon film 4 and the tungsten film 14.

Figure 7C:
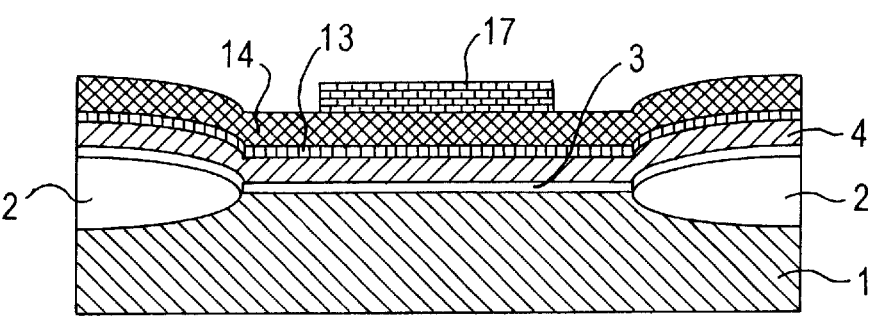
FIG. 7c is a cross-sectional view of the p-type MOS transistor illustrating a step of the method of producing the MOS transistor according to Embodiment 4 of the present invention.

In the next, as illustrated in FIG. 7c, a silicon nitride film is formed on an entire surface, and a silicon nitride film pattern 17 is formed by patterning the silicon nitride film.

Figure 7D:
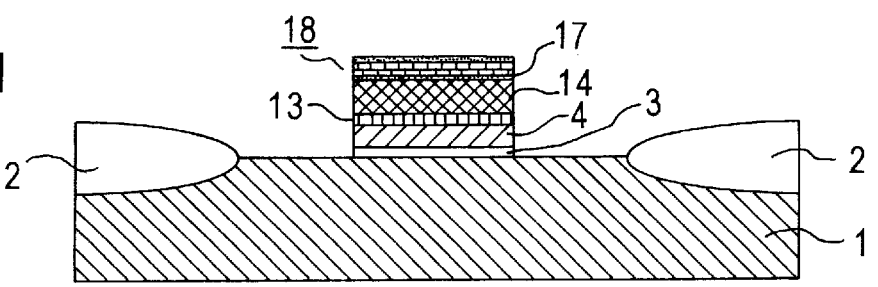
FIG. 7d is a cross-sectional view of the p-type MOS transistor illustrating a step of the method of producing the MOS transistor according to Embodiment 4 of the present invention.

In the next, as illustrated in FIG. 7d, a gate electrode 18 is formed by patterning the tungsten film 14, the tungsten nitride film 13, the polycrystalline silicon film 4, and the gate insulating film 3 using the silicon nitride film pattern 17 as a mask.

Figure 7E:
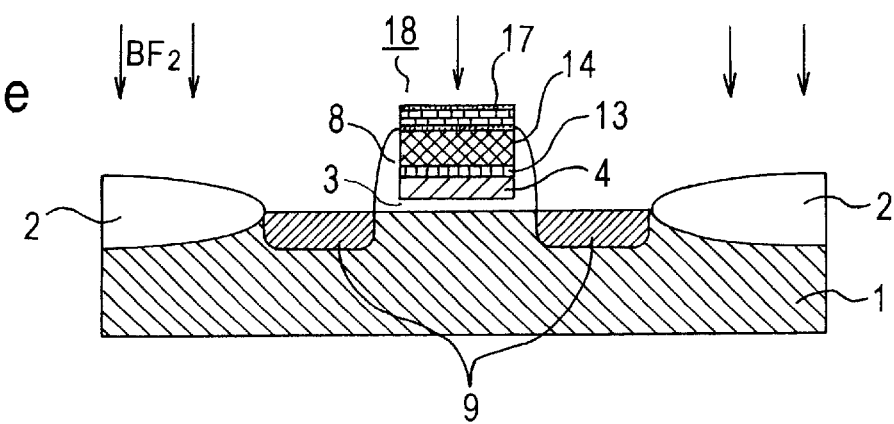
FIG. 7e is a cross-sectional view of the p-type MOS transistor illustrating a step of the method of producing the MOS transistor according to Embodiment 4 of the present invention.

In the next, as illustrated in FIG. 7e, after forming sidewalls 8 on both sides of the gate electrode 18, $BF_2$ is implanted in source/drain areas of the silicon substrate 1 on both sides of the sidewalls 8 to form a p-type impurity diffusing layer 9, and annealing at 800 through 1,000° C. is performed for activation. At this time, the silicon nitride film pattern 17 is left on the tungsten film 14 forming the gate electrode 18.

Accordingly, $BF_2$ is not implanted in the tungsten film 14 because the silicon nitride film pattern 17 works as a mask. In other words, it is possible to suppress the amount of fluorine in the tungsten film 14.

Figure 8A:
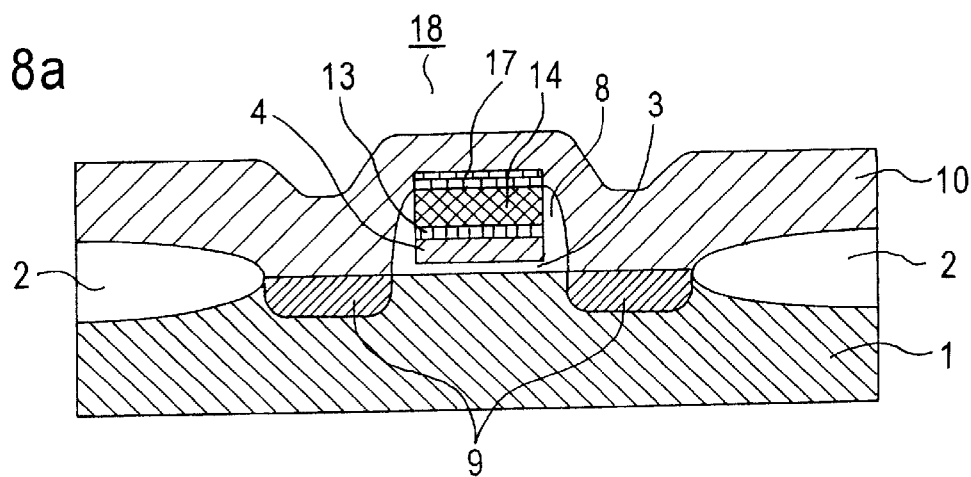
FIG. 8a is a cross-sectional view of the p-type MOS transistor illustrating a step of the method of producing the MOS transistor according to Embodiment 4 of the present invention.

In the next, in a manner similar to the above embodiment, as illustrated in FIG. 8a, an inter-layer insulating film 10 made of a silicon nitride film, a PSG film, and a BPSG film is formed on an entire surface. Thereafter, a thermal treatment at 800 through 1,000° C. is performed when the PSG film and the BPSG film are used. The thermal treatment is provided to improve a quality of the inter-layer insulating film 10 and planarize the inter-layer insulating film 10. Therefore, the thermal treatment is an indispensable step.

Figure 8B:
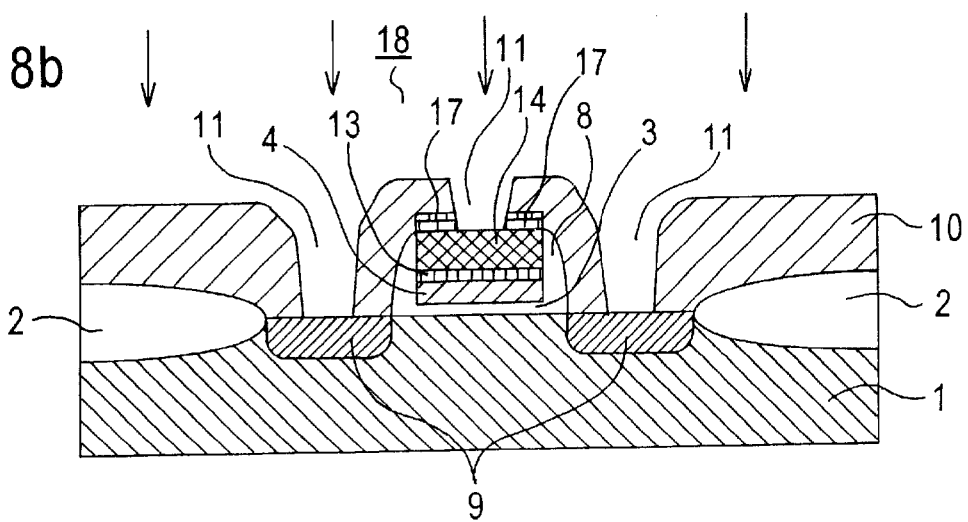
FIG. 8b is a cross-sectional view of the p-type MOS transistor illustrating a step of the method of producing the MOS transistor according to Embodiment 4 of the present invention.

In the next, as illustrated in FIG. 8b, a contact hole 11 is opened at a predetermined position on the gate electrode 18 and the impurity diffusing layer 9. Further, there is a case that an impurity of a type same as that of the impurity diffusing layer 9 is implanted in the semiconductor substrate 1 through the opening of the contact hole 11, and the impurity is diffused by applying a heat of 800 through 1,000° C.

Figure 8C:
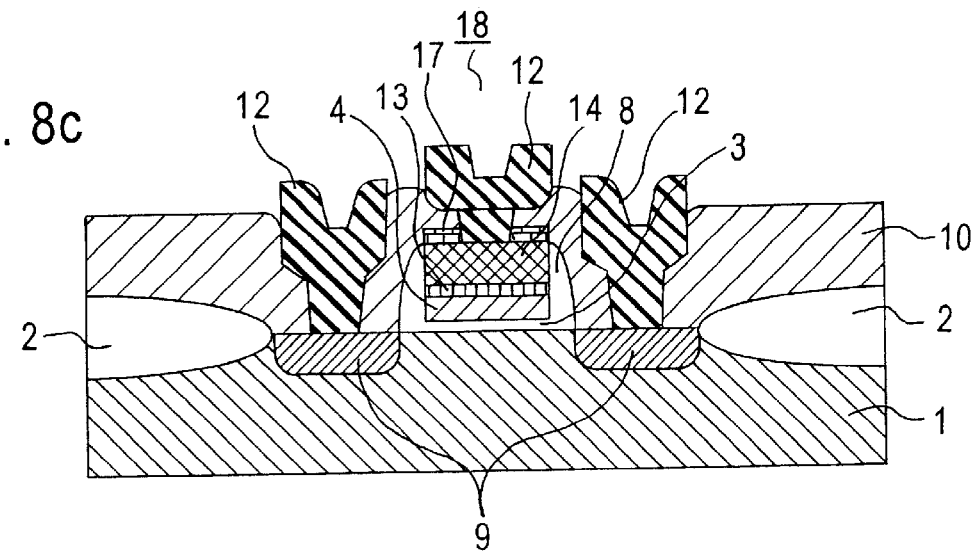
FIG. 8c is a cross-sectional view of the p-type MOS transistor illustrating a step of the method of producing the MOS transistor according to Embodiment 4 of the present invention.

Finally, as illustrated in FIG. 8c, a metallic wire 12 made of aluminum and so on is formed to complete a transistor having the gate electrode 18 formed by a polymetal wire made of the tungsten film 14, a tungsten nitride film 13, and the polycrystalline silicon film 4.

In other words, in Embodiment 4, since the silicon nitride film pattern 17 is located on the tungsten film 14 fabricating the gate electrode 18, in case that a step of ion-implanting $BF_2$ after forming the gate electrode 18, it is possible to prevent $BF_2$ from ion-implanting in the tungsten film 14 by the mask of the silicon nitride film pattern 17.

Accordingly, it is possible to sufficiently reduce fluorine contained in the tungsten film 14, and prevents an increment of a capacitance of the gate oxide film and a separation between the tungsten film 14 and the polycrystalline silicon film 4 even after the thermal treatment process.

Embodiment 5

In the above embodiment, the methods of producing the p-type MOS transistors using the polymetal wiring layers in the gate electrodes are individually described. As an example of further enhancing an effect, a case of simultaneously processing a plurality of processes described in the above embodiments will be described.

FIGS. 9a through 10c are cross-sectional views illustrating steps of a method of producing a p-type MOS transistor according to Embodiment 5 of the present invention.

Figure 9A:
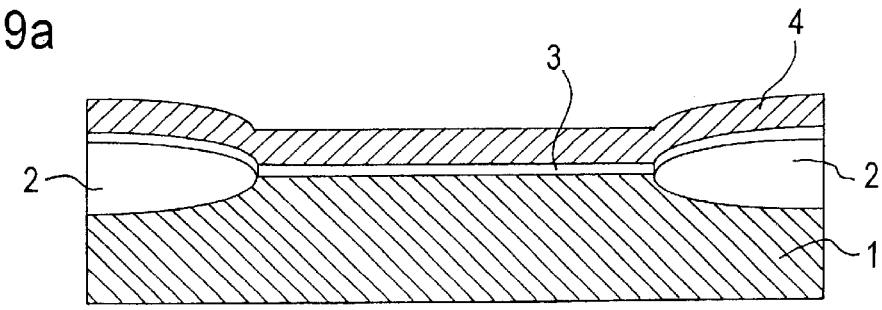
FIG. 9a is a cross-sectional view of a p-type MOS transistor illustrating a step of a method of producing the MOS transistor according to Embodiment 5 of the present invention.

At first, as illustrated in FIG. 9a, element isolation insulating films 2 are formed in a silicon substrate 1 to separate an element forming region. Thereafter, a gate oxide film 3 and a polycrystalline silicon film 4 are sequentially formed. At this time, the polycrystalline silicon film 4 has a film thickness of 50 through 200 nm. Thereafter, after ion-implanting $BF_2$ of a high concentration into the polycrystalline silicon film 4 in order to form a p-type gate wire, annealing is performed at about 600 through 1,000° C. in an atmosphere of nitrogen. It is possible to outward diffuse fluorine in $BF_2$, implanted in the polycrystalline silicon film 4.

Figure 9B:
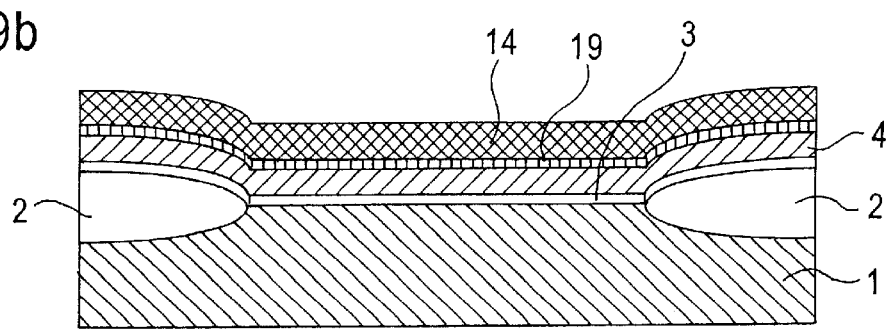
FIG. 9b is a cross-sectional view of the p-type MOS transistor illustrating a step of the method of producing the MOS transistor according to Embodiment 5 of the present invention.

In the next, as illustrated in FIG. 9b, after forming a tungsten nitride film on an entire surface of the polycrystalline silicon film 4 by a reactive sputtering using a metallic target such as a tungsten film, a tungsten silicon nitride film 19 having a thickness of about 50 Å is formed by annealing in an atmosphere of nitrogen. Thereafter, a tungsten film 14 is formed at a temperature of 200 through 400° C. using a target of tungsten having a content of fluorine of 10 ppm or less using a sputtering method.

The tungsten silicon nitride film 19 is a reaction preventing film for preventing a reaction between the polycrystalline silicon film 4 and the tungsten film 14, wherein the tungsten silicon nitride film 19 has an excellent adhesion property with the tungsten film 14 and the polycrystalline silicon film 4. In the above embodiment, the reaction preventing film of the tungsten nitride film 13 is subjected to various heat treatment processes after the formation thereof. Therefore, a part of the tungsten nitride film 13 is naturally formed in the tungsten silicon nitride film 19. However, in this embodiment, because the tungsten silicon nitride film 19 has the excellent adhesion properties with the tungsten film 14 and the polycrystalline silicon film 4, the tungsten silicon nitride film 19 is formed in an initial stage of a process of forming the reaction preventing film.

Figure 9C:
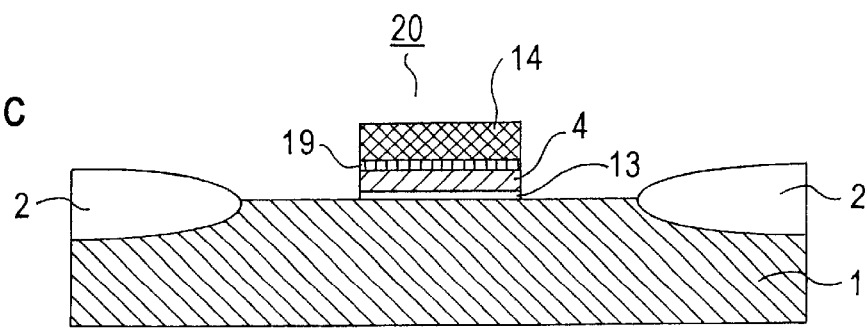
FIG. 9c is a cross-sectional view of the p-type MOS transistor illustrating a step of the method of producing the MOS transistor according to Embodiment 5 of the present invention.

In the next, as illustrated in FIG. 9c, in a similar manner to the above embodiment, the tungsten film 14, the tungsten silicon nitride film 19, the polycrystalline silicon film 4, and the gate oxide film 3 are simultaneously patterned using a resist (not shown) as a mask to form a gate electrode 20.

Figure 9D:
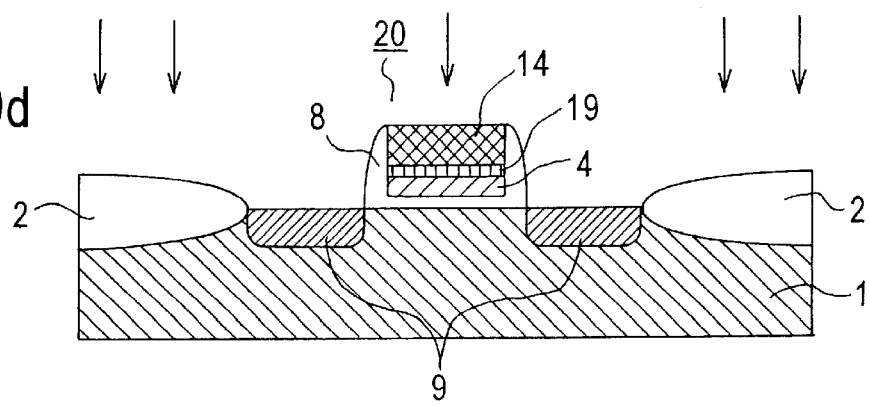
FIG. 9d is a cross-sectional view of the p-type MOS transistor illustrating a step of the method of producing the MOS transistor according to Embodiment 5 of the present invention.

In the next, as illustrated in FIG. 9d, after forming sidewalls 8 on both sides of the gate electrode 20, B is implanted in source/drain areas of the silicon substrate 1 on both sides of the sidewalls 8 to form a p-type impurity diffusing layer 9, and annealing is performed at 800 through 1,000° C. to activate this. By this process, the impurity simultaneously implanted in the tungsten film 14 at time of forming the impurity diffusing layer 9 is only B, whereby it is possible to prevent fluorine from being implanted in the tungsten film 14.

Figure 10A:
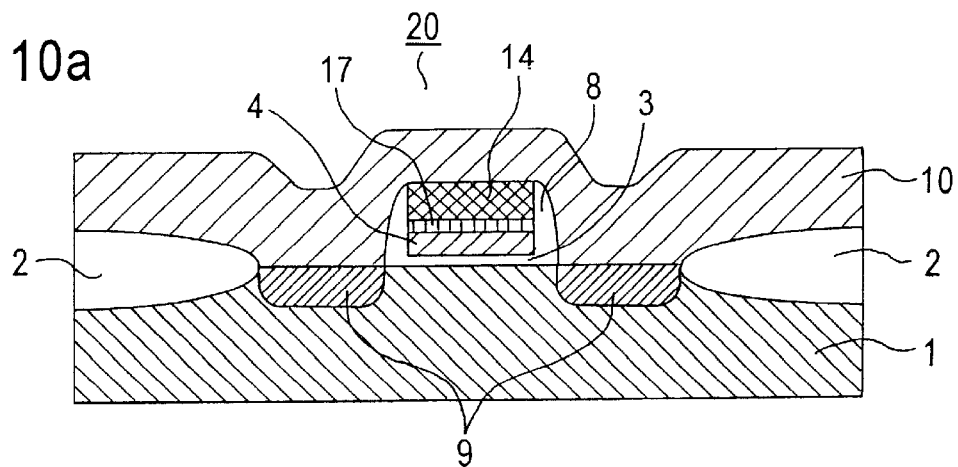
FIG. 10a is a cross-sectional view of the p-type MOS transistor illustrating a step of the method of producing the MOS transistor according to Embodiment 5 of the present invention.

In the next, as illustrated in FIG. 10a, an inter-layer insulating film 10 made of a silicon nitride film, a PSG film, and a BPSG film is formed on an entire surface. Thereafter, when the PSG film and the BPSG film are used, a thermal treatment at 800 through 1,000° C. is performed. The thermal treatment improves a quality of the inter-layer insulating film 10 and simultaneously planarizes. Therefore, the thermal treatment is an indispensable process.

Figure 10B:
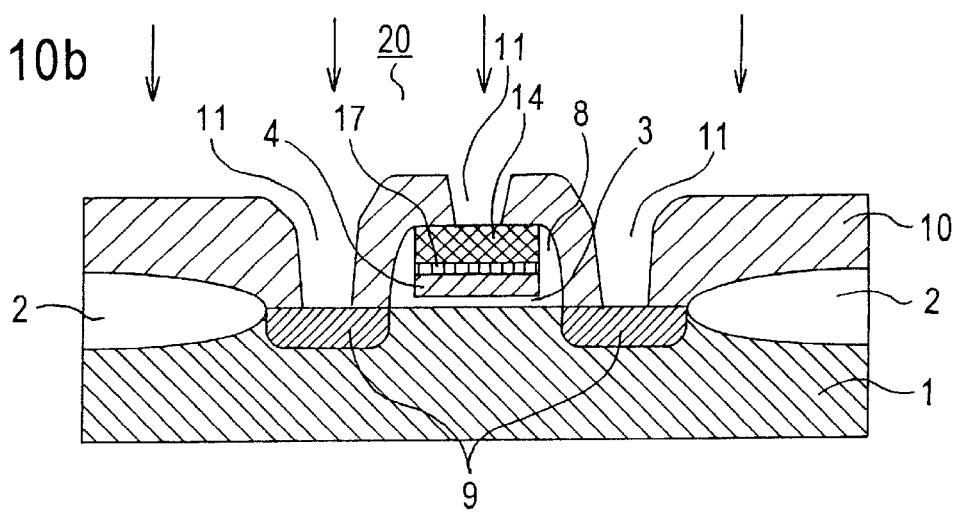
FIG. 10b is a cross-sectional view of the p-type MOS transistor illustrating a step of the method of producing the MOS transistor according to Embodiment 5 of the present invention.

In the next, as illustrated in FIG. 10b, a contact hole 11 is opened at a predetermined position in the gate electrode 20 and the impurity diffusing layer 9. Further, there is a case that B being an impurity of a type same as that of the impurity diffusing layer 9 is implanted in the semiconductor substrate 1 through the opening of the contact hole 1, and a thermal treatment at 800 through 1,000° C. is applied to diffuse the impurity.

Figure 10C:
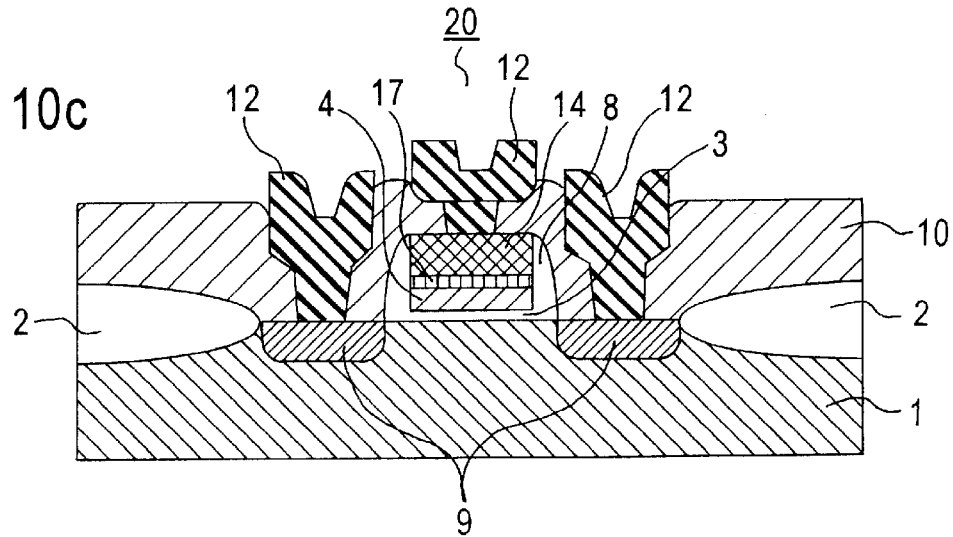
FIG. 10c is a cross-sectional view of the p-type MOS transistor illustrating a step of the method of producing the MOS transistor according to Embodiment 5 of the present invention.
Figure 11A:
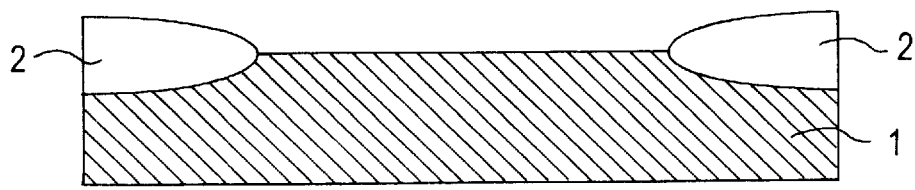
FIG. 11a is a cross-sectional view of a conventional p-type MOS transistor illustrating a step of a method of producing the MOS transistor.
Figure 11B:
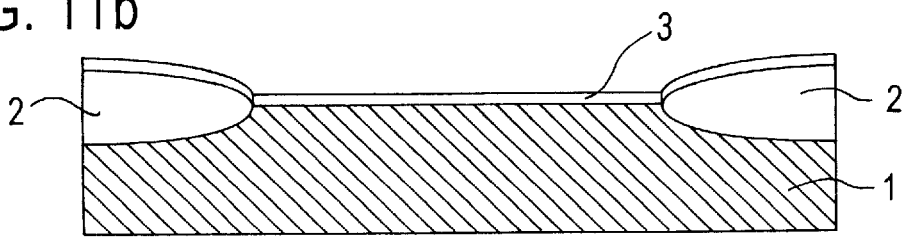
FIG. 11b is a cross-sectional view of the conventional p-type MOS transistor illustrating a step of the method of producing the MOS transistor.
Figure 11C:
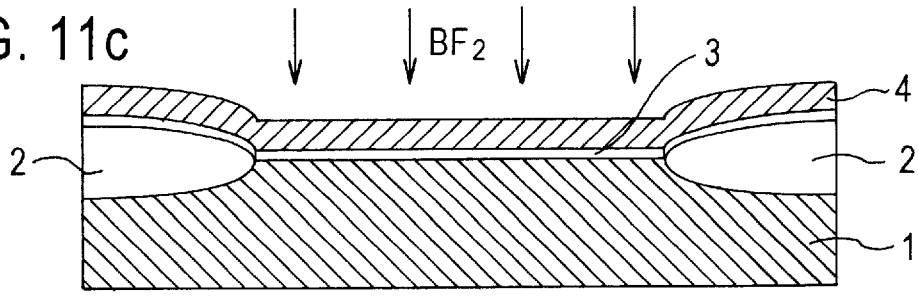
FIG. 11c is a cross-sectional view of the conventional p-type MOS transistor illustrating a step of the method of producing the MOS transistor.
Figure 11D:
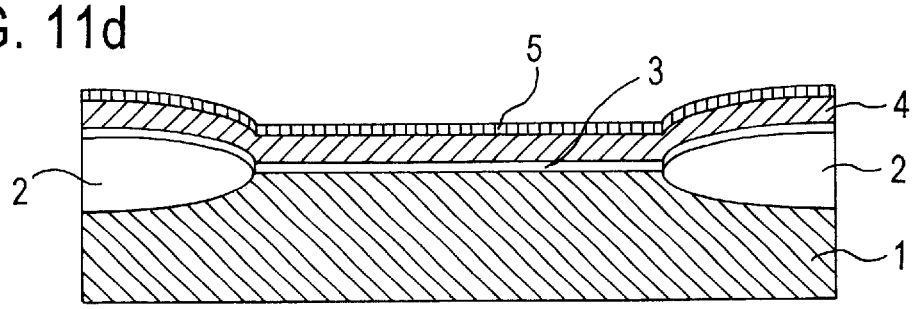
FIG. 11d is a cross-sectional view of the conventional p-type MOS transistor illustrating a step of the method of producing the MOS transistor.
Figure 11E:
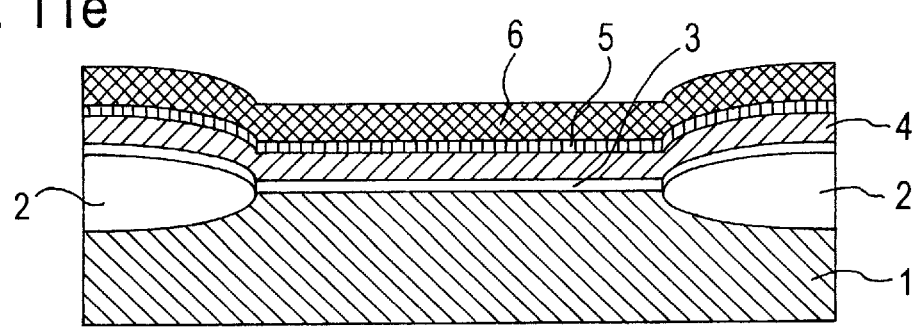
FIG. 11e is a cross-sectional view of the conventional p-type MOS transistor illustrating a step of the method of producing the MOS transistor.
Figure 12A:
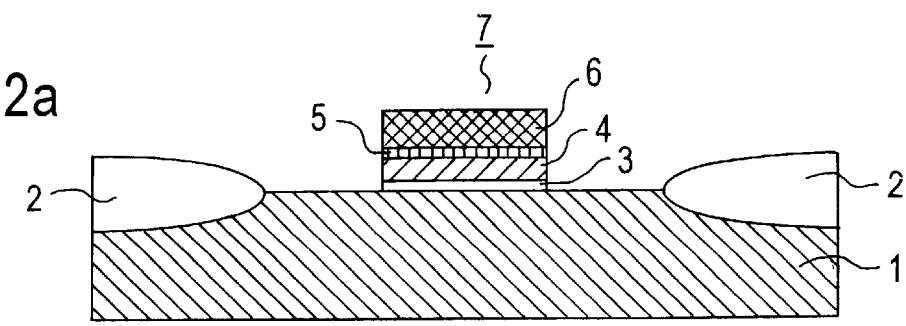
FIG. 12a is a cross-sectional view of the conventional p-type MOS transistor illustrating a step of the method of producing the MOS transistor.
Figure 12B:
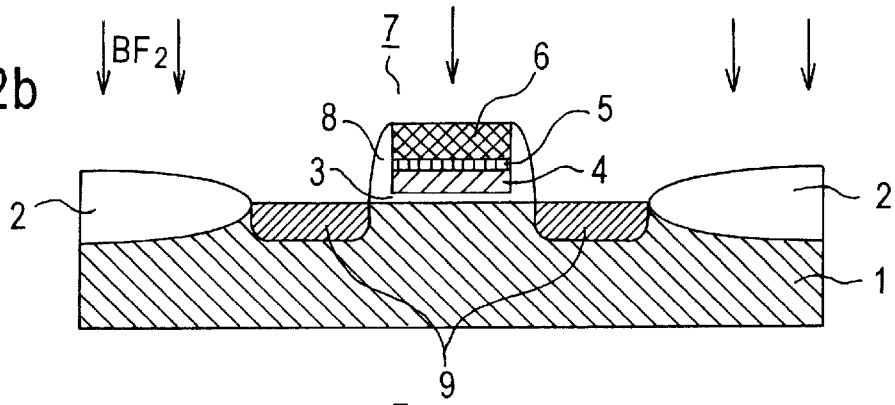
FIG. 12b is a cross-sectional view of the conventional p-type MOS transistor illustrating a step of the method of producing the MOS transistor.
Figure 12C:
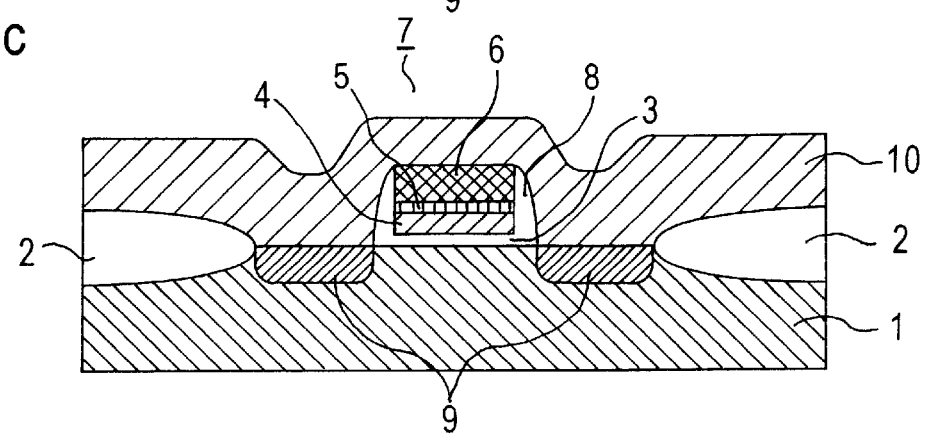
FIG. 12c is a cross-sectional view of the conventional p-type MOS transistor illustrating a step of the method of producing the MOS transistor.
Figure 12D:
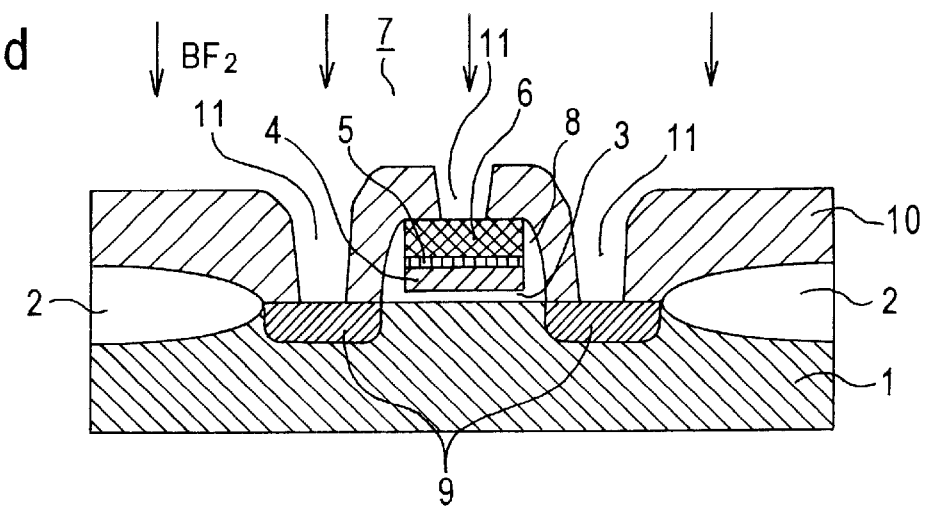
FIG. 12d is a cross-sectional view of the conventional p-type MOS transistor illustrating a step of the method of producing the MOS transistor.
Figure 13:
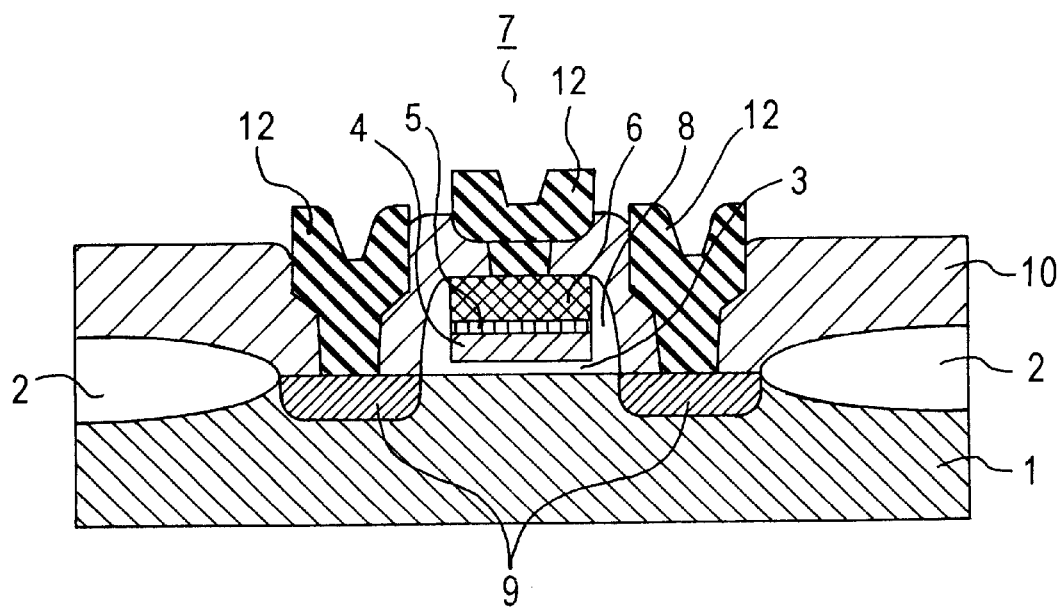
FIG. 13 is a cross-sectional view of the conventional p-type MOS transistor illustrating a step of the method of producing the MOS transistor.

Finally, as illustrated in FIG. 10c, a metallic wire 12 made of aluminum and so on is formed to complete a transistor having the gate electrode 20 formed by a polymetal wire made of the tungsten film 14, the tungsten silicon nitride film 19, and the polycrystalline silicon film 4.

In other words, in Embodiment 5, it is possible to reduce a content of fluorine in the polycrystalline silicon film 4 and the tungsten film 14, fabricating the polymetal wire forming the gate electrode 20. And, because the tungsten silicon nitride film 19 is used as the reaction preventing film, it is possible to improve adhesion properties with the polycrystalline silicon film 4 and the tungsten film 14. Further, fluorine is not implanted in the gate electrode 20 at time of forming the impurity diffusing layer 9. Accordingly, it is possible to preferably form the gate electrode 20 than in cases that each of the above embodiments is independently practiced, and prevent an increment of a capacitance of the gate oxide film 3 and a separation between the tungsten film 14 and the polycrystalline silicon film 4, which are caused by a diffusion of fluorine in the thermal treatment process.

The first advantage of the method of producing the semiconductor device according to the present invention is that fluorine contained in the tungsten film can be sufficiently reduced.

The second advantage of the method of producing the semiconductor device according to the present invention is that fluorine contained in BF2, implanted in the polycrystalline silicon film, can be outward diffused, and reduce the amount of fluorine in the polycrystalline silicon film.

The third advantage of the method of producing the semiconductor device according to the present invention is that a diffusion of fluorine from the polycrystalline silicon film to an outside can be effectively promoted.

The fourth advantage of the method of producing the semiconductor device according to the present invention is that an increment of a capacitance of the gate oxide film 3 and a separation between the tungsten film 14 and the polycrystalline silicon film 4, which are caused by a diffusion of fluorine in the thermal treatment process, can be prevented.

Obviously, numerous modifications and variations of the present invention are possible in light of the above teachings. It is therefore to be understood that within the scope of the appended claims, the invention may be practiced otherwise than as specifically described herein.

The entire disclosure of Japanese Patent Application No. 11-363865 filed on Dec. 22, 1999 including specification, claims, drawings and summary are incorporated herein by reference in its entirety.

What is claimed is:

1. A method of producing a semiconductor device comprising:

forming a gate oxide film on a silicon substrate;

ion-implanting $BF_2$ on an entire surface of a polycrystalline silicon film after forming the polycrystalline silicon film on the gate oxide film;

sequentially forming a reaction preventing film and a tungsten film on the polycrystalline silicon film;

forming a gate wiring fabricated by the gate oxide film, the polycrystalline silicon film, the reaction preventing film, and the tungsten film by patterning;

annealing the semiconductor device at 600° C. or more after ion implanting $BF_2$ in the polycrystalline silicon film and before forming the reaction preventing film, wherein the step of annealing is conducted in a vacuum or a reactive atmosphere for fluorine.

* * * * *